United States Patent
Jakob et al.

(10) Patent No.: US 6,341,976 B1
(45) Date of Patent: Jan. 29, 2002

(54) METHOD AND DEVICE FOR THE ATTACHMENT OF ELECTRICAL COMPONENTS TO A CIRCUIT BOARD

(75) Inventors: Gert Jakob, Stuttgart; Juergen Enzner, Ruegland; Kurt Stammler, Feuchtwangen; Martin Zywietz, Ludwigsburg, all of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/535,330

(22) Filed: Mar. 27, 2000

(30) Foreign Application Priority Data

Mar. 25, 1999 (DE) .......................... 199 13 660

(51) Int. Cl.[7] .................. H01R 12/00; H01R 13/62; H05K 1/00
(52) U.S. Cl. ...................................... 439/366; 439/76.1
(58) Field of Search ................ 439/264, 495, 439/259, 260, 263, 366, 76.1, 500, 607; 361/767

(56) References Cited

U.S. PATENT DOCUMENTS

| | | | |
|---|---|---|---|
| 4,928,032 A | * 5/1990 | Skoch et al. | 439/243 |
| 5,352,995 A | * 10/1994 | Mouissie | 333/181 |
| 5,528,462 A | * 6/1996 | Pendse | 361/767 |
| 6,054,961 A | * 4/2000 | Gong et al. | 343/713 |

* cited by examiner

Primary Examiner—Brian Sircus
Assistant Examiner—Chandrika Prasad
(74) Attorney, Agent, or Firm—Kenyon & Kenyon

(57) ABSTRACT

A method for the attachment of electrical components to circuit boards where the electrical components are enclosed by a housing and held in place by a retaining device. The method enables a smaller and more compact construction for switching devices. The connection of the electrical components with the housing enclosing them creates a additional point for the absorption of thermal and mechanical stresses in addition to the connection with the circuit board.

17 Claims, 1 Drawing Sheet

METHOD AND DEVICE FOR THE ATTACHMENT OF ELECTRICAL COMPONENTS TO A CIRCUIT BOARD

FIELD OF THE INVENTION

A method and a device according to the present invention are used to attach electrical components to circuit boards.

BACKGROUND INFORMATION

A mounting bracket for electrical components is already known from the related art.

The mounting bracket is formed as a flat U-shaped structural element, a circular shaped area being a located between its legs which extend vertically downwards. The two vertically extending legs terminate in soldering pins on which shouldered bearing areas are formed. The U-shaped mounting bracket is supported with these shouldered bearing areas on the circuit board after being pressed into it. In this manner, the component mounted in the circular area is always held at a constant distance from the surface of the circuit board.

The U-shaped structural element is pressed into the circuit board with its soldering pins; however, with such an attachment it is difficult to support large and heavy electrical components only at the bottom of the circuit board in a shock-resistant manner. Use of a large number of U-shaped structural elements for the mounting of large and heavy components significantly limits the installation space available on the circuit board for other components.

In addition to the outlined inadequacies of the devices known from the related art, the requirements on safety-relevant switching devices for use in automobiles have also increased sharply in relation to mass and constructional design. The mass and constructional design of electrical components are limited by strain on the soldering points, which often makes the use of standard parts difficult and requires more expensive electrical components. Furthermore, in airbag applications, for example, the acceleration sensors are mounted on a separate circuit board in order to prevent the airbags from being inadvertently triggered by intrinsic movements caused by resonant step-ups. These intrinsic movements cannot be eliminated completely when circuit boards are assembled with known assembly methods, for which reason the acceleration sensors for airbags have been mounted on an additional circuit board separated from the circuit board already mentioned.

SUMMARY OF THE INVENTION

The attachment method according to the present invention makes it possible to achieve a smaller and more compact construction for switching devices since the connection of the electrical components with the housing enclosing them creates an additional point for the absorption of thermal and mechanical stresses in addition to the connection with the circuit board. As a result, not only the soldering point now absorbs the occurring stresses but rather both of the created connection points, which eliminates the size limitation of the electrical components resulting from the strain on the soldering point. Since the additional connection of the components with the housing relieves the stress on the connection of the electrical components with the circuit board, the circuit board can be made less solid, resulting in space being made available for the integration of additional circuit parts. This permits the elimination of an additional circuit board and results in significantly more compact and smaller-sized switching devices.

In additional embodiments of the attachment method according to the present invention, the requirements of a production line for mass production of switching devices can be met by having the electrical components positioned in a defined position relative to the circuit board by the use of retaining devices. These can absorb the thermal and mechanical stresses during the production process, resulting in a reduction of stress on the soldering points, in particular. The additional connection beyond the connection with the circuit board is made by cementing the electrical component to the housing enclosing it. Advantageously, the electrical component can be connected to the top of the housing, resulting in two opposite connection points, namely with the circuit board and with the top of the housing. In addition to the top of the housing, the electrical component may also be cemented to an adjoining housing wall. In order to produce the adhesive joint, a bead of adhesive preferably of silicone adhesive is introduced between the housing and the surface of the electrical component to be affixed.

In addition to an attachment method, the present invention relates to a switching device having electrical components which are both secured to the circuit board and connected to the housing, the housing having a structure adapted to the electrical component. In an advantageous embodiment of the housing structure, it is designed as ribbed structure; the ribbed structure can be provided both on a housing top covering the electrical component and on a wall of the housing adjoining the electrical component. The ribbed structure includes ribs that are sized differently in height and width between which pockets for receiving excess adhesive are positioned. In order to improve the positive fit of the adhesive bead and the surface of the electrical component to be affixed, recesses or projections may be provided on the surface of the electrical component, making it possible to eliminate a relative motion between the component and the housing at the adhesive joint. Moreover, the ribbed structure on adjoining housing parts serves to increase the effective adhesive joint surface between the adhesive bead and the housing.

DETAILED DESCRIPTION

Figure 1:
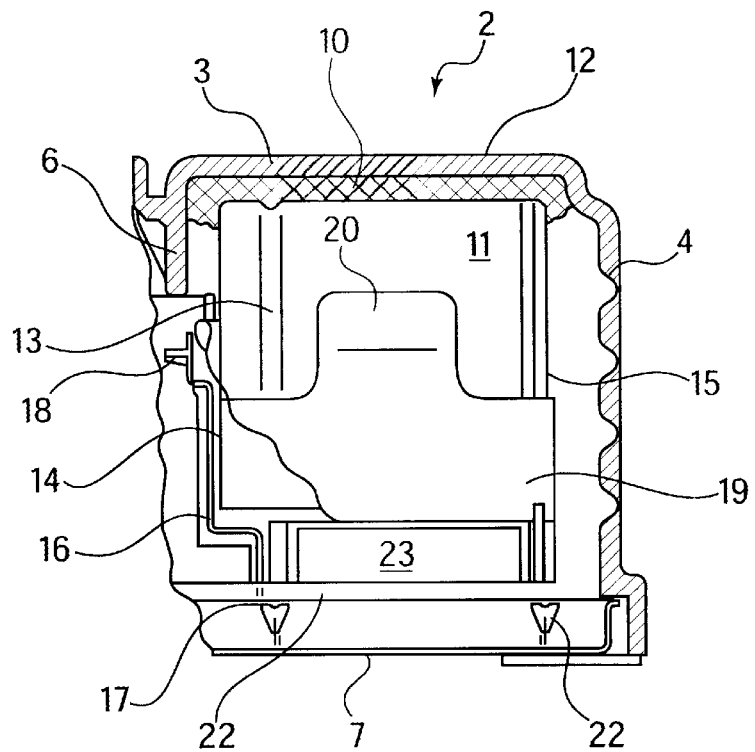
FIG. 1 shows an electrical component affixed between the housing top and the circuit board in cross-section.

FIG. 1 shows a cross-section of an electrical component 11 affixed between a circuit board 1 and a housing 2.

The top of circuit board 1 is enclosed by a housing 2 which has a housing top 3 and a housing wall 4. The bottom of circuit board 1 is enclosed by a cover pan 7 which shields contact pins 17 of an electrical component which penetrate circuit board 1 and a pin of a retaining device 19 against contamination. In the area of housing top 3, housing 2 can, for example, be provided with a ribbed structure 5 which, however, can also be provided on a housing wall 4 adjoining electrical component 11. The design of ribbed structure 5 is shown in cross-section in FIG. 2 as an example.

Retaining device 19 which partially encloses electrical component 11 has two pins 22 inserted into circuit board 1 and mechanically connects the electrical component to circuit board 1. The electrical connection of electrical component 11 is ensured by two contact pins 17 which are formed on one contact 16 of electrical component 11. An electrical terminal 18 is provided on a terminal-side face 14 of electrical component 11 while a rear face 15 of electrical component 11 faces housing wall 4.

In addition to the mechanical connection with circuit board 1, which is formed by retaining device 19 with pins 22 which partially encloses electrical component 11, electrical element 11 is cemented to housing 2 by an adhesive joint 10. In the embodiment shown, an adhesive joint 10 is applied to surface 12 of electrical component 11 via which housing top 3 and electrical component 11 are joined together.

In order to take into account the requirements of production lines for the production of electrical switching devices in large numbers of units, the method of attachment according to the present invention provides for a preassembly in a form such that electrical component 11 is premounted into a retaining device 19. The preassembly ensures that electrical component 11 is held in a certain position above circuit board 1 during the assembly process in the production line and the electrical connection is produced by the engagement of contact pins 17 of contact plate 16 in circuit board 1. During the production process, during the assembly of circuit board 1 and the soldering of contact pins 17, retaining device 19 absorbs the mechanical and thermal stresses that can occur during handling and wave soldering. In order to absorb the mechanical stresses during the operation of the switching device in an automobile, electrical component 11 according to the method of the present invention is cemented to housing 2 so that electrical component 11 is connected mechanically to circuit board 1 via retaining device 19 which partially encloses it and its surface 12 is also connected to housing 2 by an adhesive bead 10. Thus electrical component 11 is supported at two points with the result that the mechanical stresses resulting from shocks and temperature change in an automobile need not be absorbed exclusively by one point of support but rather can be distributed over two points of support. As a result, the mechanical connection of electrical component 11 by retaining device 19 can be simplified in such a way that below electrical component II to be affixed additional new installation space 23 on the surface of circuit board 1 is made available which can be efficiently used for the arrangement of additional components of the switching device.

The support of electrical component 11 at two points makes it possible for the natural vibration of circuit board 1 to be positively influenced in such a way that even acceleration sensors for airbag applications can now be accommodated in additional installation space 23 on circuit board 1. Mounting the acceleration sensors in the additionally available installation space 23 on circuit board 1 makes the use of an additional, second circuit board obsolete. The method for the attachment of electrical components according to the present invention permits the implementation of significantly smaller and more compact switching devices. Via the proposed attachment method, it is possible to use more economical and more advanced standard types—electrolytic capacitors, for example—which could not previously be used in circuit boards because their weight and design exerted excessive stress on the soldering points. The creation of an additional connecting point to absorb the mechanical and thermal stresses acting on component 11 has now eliminated this limitation for electrical component 11.

Figure 2:
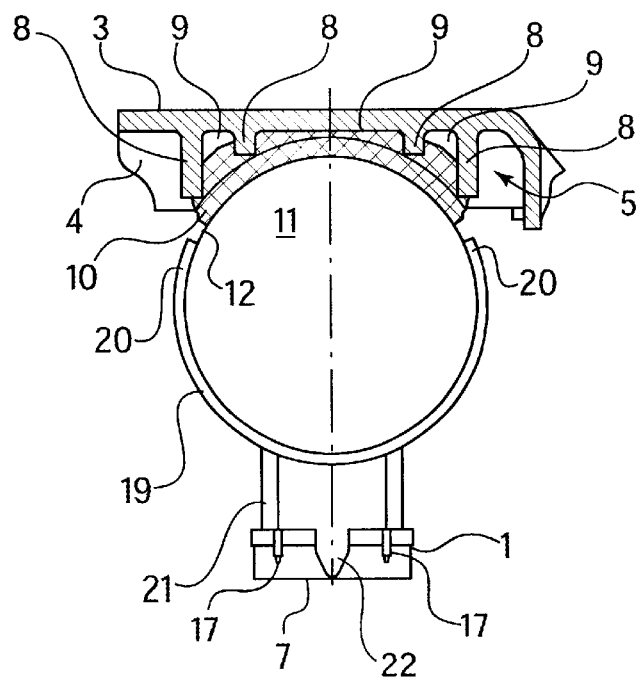
FIG. 2 shows a front view of an electrical component which is connected to the circuit board by a retaining device and to the housing by an adhesive joint.

FIG. 2 shows the front view of an electrical component 11 which is connected to circuit board 1 by a retaining device 19 and to housing 2 by an adhesive joint 10.

A ribbed structure 5 is located in housing top 3, the design of ribbed structure 5 being adapted to the surface contour 12 of electrical component 11 to be affixed. If the shape of electrical component 11 is cylindrical, it is expedient to design ribbed structure 5 in housing top 3 in such a way that ribs 8 extending at surface 12 are of varying design. Individual pockets 9 can be provided between ribs 8, the pockets serving to receive excess adhesive and to enlarge the effective adhesive surface between housing top 3 and surface 12 of electrical component 11. Ribbed structure 5 shown in FIG. 2 may also be provided on a housing wall 4 of housing 2 adjoining electrical component 11 to be affixed, also making it possible to obtain two points of support for absorbing the mechanical and thermal stress. Adhesive bead 10 between surface 12 and housing top 3 is preferably made of silicone adhesive; retaining device 19 which encloses electrical component 11 for the most part has two holding faces 20 which extend into the vicinity of the ends of adhesive bead 10 to ensure the highest degree of mechanical load-bearing capacity.

Pins 22 lying between contact pins 17 are formed at foot 21 of retaining device 19, retaining device 19 being mechanically connected to circuit board 1 by pins 22. In the representation according to FIG. 1, surface 12 of electrical component 11 has a recess 13. Via this recess 13, which may, for example, extend in the shape of a ring, it is possible to obtain a positive connection between the adhesive and surface 12 of electrical component 11, the positive connection improving the mechanical load-bearing capacity; instead of forming a recess 13 in surface 12 of electrical component 11, it is also possible to form a projection in surface 12 which, extending into adhesive bead 10, also contributes to the improvement of the positive fit between electrical component 11 and adhesive bead 10.

PARTS LIST 1 circuit board
2 housing
3 housing top
4 housing wall
5 housing ribbed structure
6 housing rib
7 covering pan
8 ribs
9 pockets
10 adhesive bead
11 electrical component
12 component surface
13 ring-shaped recess
14 terminal-side face
15 back face
16 contact plate
17 contact pin
18 terminal
19 retaining device
20 holding faces
21 foot
22 pin
23 installation space

What is claimed is:

1. A method for attaching an electrical component to a circuit board, comprising the steps of:

using a retaining device, wherein the retaining device holds the electrical component in the circuit board during an assembly procedure and in operation wherein the electrical component includes contacting pins and the retaining device connects the contacting pins to the circuit board; and joining the electrical component to a housing surface of a housing, the housing enclosing the circuit board.

2. The method according to claim 1, further comprising the step of:

during the assembly procedure in a production line, holding the electrical component in a predefined position relative to the circuit board using the retaining device.

3. The method according to claim 1, wherein the retaining device absorbs mechanical and thermal stresses which occur during the assembly procedure.

4. The method according to claim 1, further comprising the step of:

cementing a surface of the electrical component to the housing surface of the housing.

5. The method according to claim 3, further comprising the step of:

cementing the electrical component to a housing top of the housing.

6. The method according to claim 3, further comprising the step of:

joining the housing and a surface of the electrical component using an adhesive bead.

7. The method according to claim 6, wherein the adhesive bead is composed of a silicone adhesive.

8. A switching device, comprising:

a retaining device;

a housing;

a circuit board being enclosed by the housing; and an electrical component being situated on the circuit board, the electrical component including contact pins, the electrical component being (a) fixed in a predetermined position in the circuit board via the retaining device and (b) connected to the housing, wherein the housing has a housing structure which is adapted to a shape of the electrical component.

9. The switching device according to claim 8, wherein the housing structure includes a housing top and a housing side wall.

10. The switching device according to claim 9, wherein the housing top includes a ribbed structure.

11. The switching device according to claim 9, wherein the housing side wall includes a ribbed structure.

12. The switching device according to claim 9, wherein the ribbed structure has ribs of varying size.

13. The switching device according to claim 12, wherein the ribbed structure includes individual pockets, the individual pockets being situated between the ribs.

14. The switching device according to claim 8, further comprising:

recesses situated on the electrical component, the recesses improving a positive fit with an adhesive joint.

15. The switching device according to claim 8, further comprising:

projections formed above the electrical component, the projections improving a positive fit with an adhesive joint.

16. The switching device according to claim 9, wherein at least one of the housing top and the housing side wall includes a ribbed structure.

17. The method according to claim 1, wherein the housing surface comprises a ribbed structure.

* * * * *